United States Patent
Göbl et al.

(10) Patent No.: US 9,768,036 B2
(45) Date of Patent: Sep. 19, 2017

(54) POWER SEMICONDUCTOR SUBSTRATES WITH METAL CONTACT LAYER AND METHOD OF MANUFACTURE THEREOF

(75) Inventors: Christian Göbl, Nürnberg (DE); Heiko Braml, Wiesenttal (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 162 days.

(21) Appl. No.: 12/152,021

(22) Filed: May 12, 2008

(65) Prior Publication Data
US 2009/0008784 A1   Jan. 8, 2009

(30) Foreign Application Priority Data

May 12, 2007   (DE) .................. 10 2007 022 336

(51) Int. Cl.
*H01L 23/48*   (2006.01)
*H01L 21/44*   (2006.01)
(Continued)

(52) U.S. Cl.
CPC ........ *H01L 21/4867* (2013.01); *C04B 35/645* (2013.01); *C04B 37/021* (2013.01); *C04B 37/026* (2013.01); *H01L 23/3735* (2013.01); *H01L 24/48* (2013.01); *H05K 3/1283* (2013.01); *H05K 3/247* (2013.01); *C04B 2237/124* (2013.01); *C04B 2237/125* (2013.01); *C04B 2237/343* (2013.01); *C04B 2237/407* (2013.01); *C04B 2237/408* (2013.01); *C04B 2237/704* (2013.01); *C04B 2237/706* (2013.01); *C04B 2237/72* (2013.01); *H01L 23/49811* (2013.01); *H01L 25/072* (2013.01); *H01L 2224/05644* (2013.01); *H01L 2224/48091* (2013.01); *H01L 2224/48227* (2013.01); *H01L 2224/48472* (2013.01); *H01L 2224/75317* (2013.01); *H01L 2224/85444* (2013.01);
(Continued)

(58) Field of Classification Search
CPC .. H01L 21/4867; H01L 23/3735; H01L 24/48
USPC .... 438/612, 654, 686; 257/762, 784, E23.01
See application file for complete search history.

(56) References Cited

U.S. PATENT DOCUMENTS 4,903,886 A * 2/1990 Schwarzbauer .............. 228/106
5,379,942 A   1/1995 Kuhnert et al.
(Continued)

FOREIGN PATENT DOCUMENTS

DE   34 14 065   12/1985
DE   42 33 073   4/1994
(Continued)

*Primary Examiner* — Daniel Shook
(74) *Attorney, Agent, or Firm* — The Law Offices of Roger S. Thompson

(57) ABSTRACT

A power semiconductor substrate comprising an insulating planar base, at least one conductor track and at least one contact area as part of the conductor track, wherein a layer of a metallic material is disposed on the contact area by means of pressure sintering. The associated method comprises the steps of: producing a power semiconductor substrate that includes a planar insulating base, conductor tracks and contact areas; arranging a pasty layer, composed of a metallic material and a solvent, on at least one contact area of the power semiconductor substrate; and applying pressure to the pasty layer.

10 Claims, 2 Drawing Sheets

(51) Int. Cl.

| | | |
|---|---|---|
| *H01L 21/48* | (2006.01) | |
| *H01L 23/373* | (2006.01) | |
| *H01L 23/00* | (2006.01) | |
| *H05K 3/12* | (2006.01) | |
| *H05K 3/24* | (2006.01) | |
| *C04B 35/645* | (2006.01) | |
| *C04B 37/02* | (2006.01) | |
| *H01L 23/498* | (2006.01) | |
| *H01L 25/07* | (2006.01) | |
| *H05K 1/03* | (2006.01) | |
| *H05K 3/06* | (2006.01) | |

(52) U.S. Cl.
CPC ............... *H01L 2924/00014* (2013.01); *H01L 2924/01004* (2013.01); *H01L 2924/014* (2013.01); *H01L 2924/01006* (2013.01); *H01L 2924/01013* (2013.01); *H01L 2924/01014* (2013.01); *H01L 2924/01019* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H05K 1/0306* (2013.01); *H05K 3/06* (2013.01); *H05K 2201/0133* (2013.01); *H05K 2201/035* (2013.01); *H05K 2203/0191* (2013.01); *H05K 2203/0278* (2013.01); *H05K 2203/1131* (2013.01)

(56) References Cited

U.S. PATENT DOCUMENTS

| | | |
|---|---|---|
| 5,807,626 A | 9/1998 | Naba |
| 6,228,196 B1 | 5/2001 | Sakamoto et al. |
| 6,432,239 B1 | 8/2002 | Mandai et al. |
| 6,812,559 B2 | 11/2004 | Palm et al. |
| 2004/0245548 A1* | 12/2004 | Stockmeier et al. ......... 257/202 |
| 2007/0183920 A1* | 8/2007 | Lu et al. ......................... 419/9 |

FOREIGN PATENT DOCUMENTS

| | | |
|---|---|---|
| DE | 100 62 108 | 6/2002 |
| DE | 10 2004 019 567 | 1/2006 |
| DE | 10 2005 047 567 | 3/2007 |

* cited by examiner

POWER SEMICONDUCTOR SUBSTRATES WITH METAL CONTACT LAYER AND METHOD OF MANUFACTURE THEREOF

BACKGROUND OF THE INVENTION

1. Field of the Invention

The invention is directed to a power semiconductor substrate and a method of manufacturing such a substrate, more particularly, to such a power semiconductor substrate in which a layer of a metallic material is applied to a contact area thereof.

2. Description of the Related Art

The invention relates to power semiconductor substrates that include an insulating base body, at least one conductor track and at least one contact area of one of said conductor tracks. Power semiconductor substrates of this type are known by way of example as AMD (active metal braze), DCB (direct copper bonding) or IMS (insulated metal substrate) substrates.

The contact area, as part or section of a conductor track, provides an electrically conductive connection, for example, to power semiconductor components or to external connections. Connecting elements of this type may, for example, be formed with the contact area by soldering connections or pressure-contact-connected connections. Connections with contact springs are of particular interest here especially in the case of pressure-contact-connected connections.

In accordance with the prior art, DCB substrates are known which comprise a ceramic base, often aluminium oxide or aluminium nitride, with conductor tracks composed of a copper film arranged thereon. Conductor tracks of this type are preferred for soldering connections and in this case form the contact area themselves. It is likewise known to form some or all of the contact areas with an additional thin layer of gold, preferably having a thickness of a few (no more than 15) atomic layers. This is advantageous particularly for contact areas of wire bonding connections. These contact areas are not sufficient in conjunction with pressure-contact-connected terminal elements, such as auxiliary or load terminal elements of power semiconductor modules, which can be formed as contact springs in accordance with the prior art. As a result of the thermal loading and the application of pressure, the contact feet of the contact springs can damage the thin layer of gold and therefore impair the reliability of the contact.

SUMMARY OF THE INVENTION

It is an object of the invention to provide a power semiconductor substrate having improved contact properties of the contact areas especially for pressure-contact-connected applications, and of providing a simple and cost-effective method for producing a power semiconductor substrate of this type.

According to the invention, a power semiconductor substrate comprises an insulating planar base, at least one conductor track and at least one contact area as part of said conductor track. A preferably at least 10 micrometers thick layer of a metallic material is disposed on the contact area by a pressure sintering connection. In this case, "pressure sintering connection" should be understood to mean that a layer of a material is arranged by the method mentioned below.

In this case, it is preferred if the second metallic material has a proportion of more than 90 percent of a noble metal. In this case, it is particularly preferred if said noble metal is silver.

Furthermore, it may be preferred for a further metallic layer of a noble metal, preferably gold, having a layer thickness of a few (no more than 15) atomic layers to be disposed between the contact area and the metallic layer.

The inventive method for producing a power semiconductor substrate of this type comprises the following steps:

Producing a power semiconductor substrate comprising a planar insulating base, conductor tracks and contact areas as part of said conductor tracks;

Placing a pasty layer, composed of a metallic material and a solvent, on at least one contact area of the power semiconductor substrate; and Applying pressure to the pasty layer.

In this embodiment, it is preferred for the majority of the solvent to be driven out of the pasty layer prior to the application of pressure.

It may be preferred for the pasty layer to be applied by a stencil printing method. In such an embodiment, it is possible to achieve the required positioning accuracy, with the layer thickness required in a cost-effective manner.

One advantageous embodiment of applying pressure to the pasty layer may be to employ a press and two pressing rams. In this case, it is additionally preferred if at least one pressing ram is formed with a quasi-hydrostatic pressure generating silicon pad arranged thereon.

In this case, it is likewise preferred for a film, preferably a Teflon film, to be arranged on the power semiconductor substrate and for pressure subsequently to be applied to this composite.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Particularly preferred embodiments of this power semiconductor substrate and of its production method are described in more detail on the basis of the exemplary embodiments of FIGS. 1 to 3.

DETAILED DESCRIPTION OF THE PRESENTLY PREFERRED EMBODIMENTS

Figure 1:
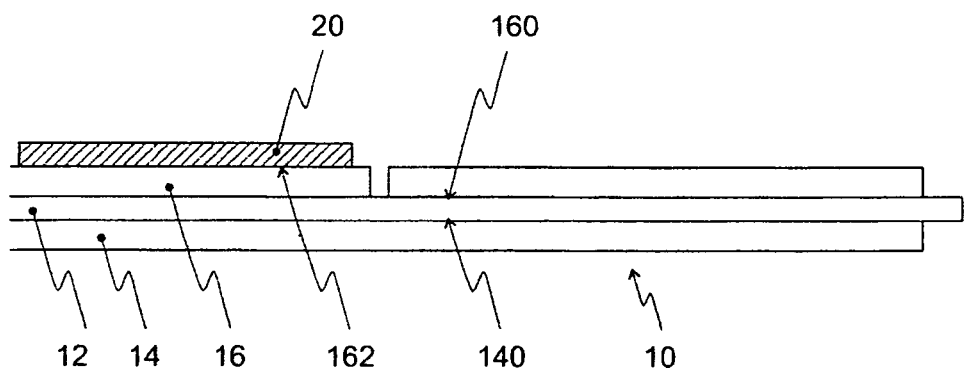
FIGS. 1 and 2 show individual steps of the inventive method for producing a first power semiconductor substrate according to the invention.
Figure 2:
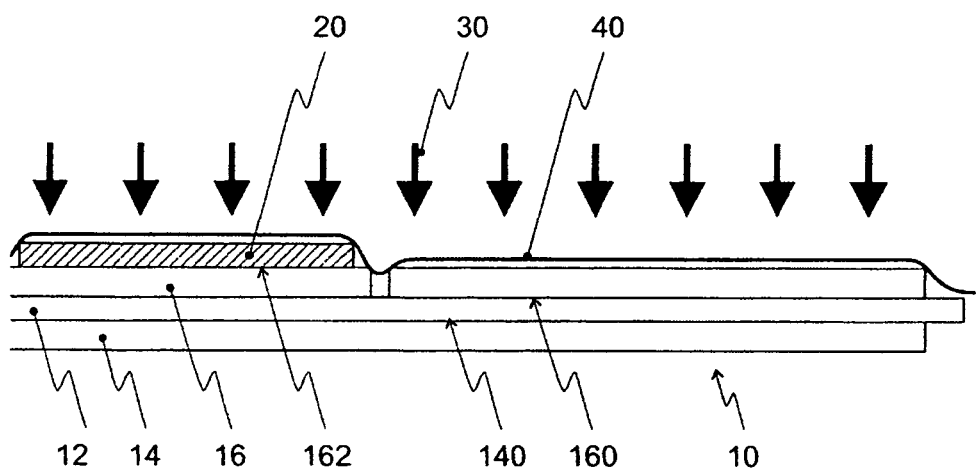

FIGS. 1 and 2 show individual steps of the inventive method for producing a first power semiconductor substrate 10. FIG. 1 illustrates a power semiconductor substrate 10 on the basis of a known DCB substrate. Substrate 10 has a ceramic base body 12, with a thickness of from about 250 μm to about 700 μm, composed of aluminium oxide and metallic coatings 14, 16 arranged on two main areas 140, 160 of said base body 12. Said coatings are preferably formed as copper films having a thickness of between about 200 μm and about 500 μm. Copper film 14 on the first main area 140 of base 12 is formed in planar fashion and thermal contact with a heat sink (not illustrated). Copper film 16 on the second main area 160 of base 12 is inherently structured and therefore itself forms the conductor tracks and also contact areas 162.

In other preferred configurations, the conductor tracks can also have a covering layer over a substantial part of their course. In configurations of this type, the contact areas 162 have no covering and can therefore be connected to semiconductor components, connecting or terminal elements.

In accordance with the inventive method, in a first step (not explicitly illustrated), preferably by means of stencil printing technology, a pasty layer 20, such as is known from prior art sintering connections, is arranged on a contact area 162 or a part of a conductor track. In this case, it is particularly preferred if the layer thickness of said pasty layer is between about 10 μm and about 200 μm.

The pasty layer 20 itself comprises a mixture of a metallic material in the form of metal flakes having a maximum extent of the order of magnitude of micrometers and a solvent. A suitable material for the metal flakes is silver, in particular, but also other noble metals or mixtures having a noble metal proportion of more than 90 percent.

FIG. 2 shows the application of pressure shown generally by arrows 30 to pasty layer 20 to form a metallic layer. Prior to this application of pressure 30, it is advantageous to drive at least 95 percent of the solvent out of pasty layer 20. This is preferably achieved by heating power semiconductor substrate 10 to at least about 350 K. This heating is also maintained or increased during the subsequent application of pressure 30.

Additionally illustrated and also preferred here is a film 40 (FIG. 2), for example a Teflon film, which is applied prior to the application of pressure 30. In this case, it is preferred to cover the entire power semiconductor substrate 10 with film 40. It is possible in some embodiments, however, to selectively cover only the respective pasty layer 20 with the film 40.

In order to form a sufficiently adhering connection between pasty layer 20 and contact area 162, it is preferred if the maximum end pressure when applying pressure 30 is at least 8 MPa.

Figure 3:
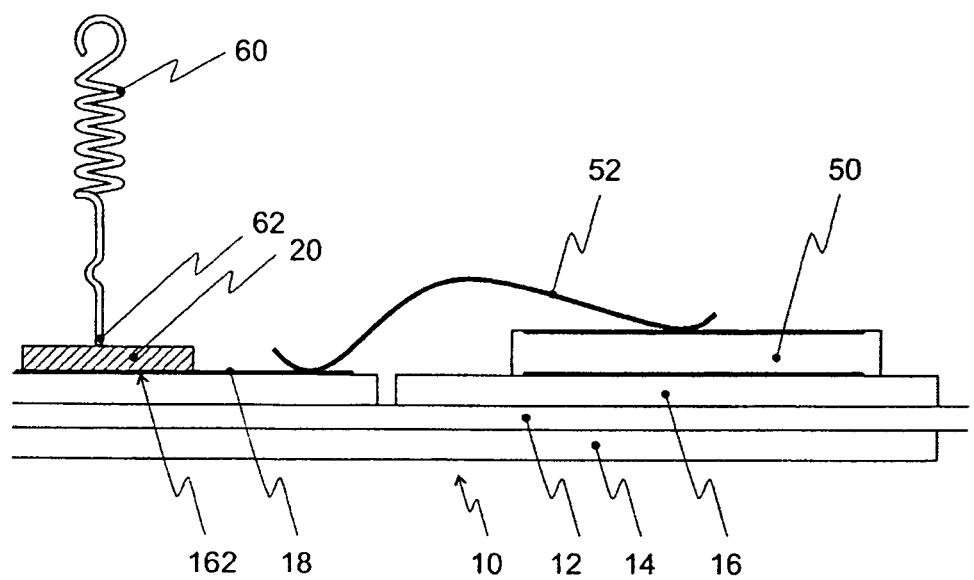
FIG. 3 shows an arrangement with a second power semiconductor substrate according to the invention.

FIG. 3 shows an arrangement with a second power semiconductor substrate 10 according to the invention, a power semiconductor component 50 and a contact spring 60. Power semiconductor substrate 10 is once again preferably a DCB substrate as illustrated in FIG. 1. A power semiconductor component 50, here a power diode, is arranged on a conductor track 16 of said substrate and is soldered to conductor track 16, where this connecting variant is to be understood as a preferred, but not required, aspect of the embodiment.

Power diode 50 is furthermore connected to a second conductor track 16 by a wire bonding connection 52, which is likewise not restrictive. The second conductor track has, in the region of contact area 162, a thin layer 18 of gold having a thickness in the region of a few (no more than 15) atomic layers in order to improve electrical contact with the bonding wire 52. According to the invention, a metallic layer 20 is arranged on gold layer 18, according to the method described above. Layer 20 is a layer of silver and has a thickness of more than about 10 μm. Other materials are likewise suitable, preferably having a proportion of a noble metal of more than about 90 percent.

A contact spring 60 such as is known for pressure-contact-connected terminal elements is also illustrated in FIG. 3. Contact foot 62 of spring 60 is connected to metallic layer 20 and represents the contact of a terminal element leading towards the outside, for example out of a power semiconductor module.

One advantage of the inventive power semiconductor substrate 10 is that, as a result of the thickness of metallic layer 20 of more than about 10 μm, preferably of more than about 50 μm, an excellent projecting contact area is formed in order to form permanent and very high-quality connections in combination with pressure-contact-connected contact springs 60.

The production according to the invention corresponds to the prior art with regard to the required materials and the necessary equipment of a pressure sintering connection. As a result of this, the production of a power semiconductor substrate 10 of this type is possible particularly advantageously, because it is simple and cost-effective.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A substrate for supporting a power semiconductor, the substrate comprising:
   an insulating planar base;
   at least one conductor track having at least one contact area; and
   a layer of a metallic material disposed on top of said contact area and electrically connected thereto by a pressure sinter connection, said metallic material not being sintered to the power semiconductor, and being the uppermost layer of the substrate forming a contact surface for electrical connection, said contact surface being separate from said power semiconductor.

2. The power semiconductor substrate of claim 1, wherein said layer of metallic material is at least 10 micrometers thick and has a proportion of more than 90 percent of a noble metal.

3. The power semiconductor substrate of claim 2, wherein said noble metal is silver.

4. The power semiconductor substrate of claim 1, further comprising a second metallic layer of a noble metal having a layer thickness of no more than fifteen atomic layers disposed between said contact area and said layer of metallic material.

5. A method for producing a substrate for supporting a power semiconductor, comprising the steps of:
   producing a power semiconductor substrate including a planar insulating base and at least one conductor track having at least one contact area;

arranging a top pasty layer composed of a metallic material and a solvent, on at least one of said contact areas, but not on the power semiconductor; and applying pressure to said pasty layer, and thereby sintering said metallic material to said at least one of said contact areas, but not to said power semiconductor;

whereby said sintered metallic material becomes the uppermost layer of the substrate forming a contact surface for electrical connection, said contact surface being separate from said power semiconductor.

6. The method of claim 5, wherein said pasty layer is applied by means of a stencil printing method.

7. The method of claim 5, wherein said pressure is applied by means of a press and two pressing rams, wherein at least one pressing ram is formed with a quasi-hydrostatic pressure generating silicone pad arranged thereon.

8. The method of claim 5, wherein the maximum end pressure applied to said pasty layer is at least 8 MPa.

9. The method of claim 5, further comprising the step of heating said power semiconductor substrate to at least about 350° K during the application of pressure thereto.

10. The method of claim 5, further comprising the step of covering said power semiconductor substrate with a film prior to the application of pressure thereto.

* * * * *